United States Patent
Voronov et al.

(10) Patent No.: US 8,226,448 B2
(45) Date of Patent: Jul. 24, 2012

(54) LASER BEAM IRRADIATION APPARATUS FOR SUBSTRATE SEALING, AND METHOD OF MANUFACTURING ORGANIC LIGHT EMITTING DISPLAY DEVICE BY USING THE LASER BEAM IRRADIATION APPARATUS

(75) Inventors: Alexander Voronov, Yongin (KR);
Gyoo-Wan Han, Yongin (KR);
Tae-Wook Kang, Yongin (KR);
Cheol-Lae Roh, Yongin (KR)

(73) Assignee: Samsung Mobile Display Co., Ltd., Giheung-Gu, Yongin, Gyunggi-Do (KR)

(*) Notice: Subject to any disclaimer, the term of this patent is extended or adjusted under 35 U.S.C. 154(b) by 0 days.

(21) Appl. No.: 12/979,634

(22) Filed: Dec. 28, 2010

(65) Prior Publication Data
US 2011/0177746 A1     Jul. 21, 2011

(30) Foreign Application Priority Data
Jan. 19, 2010 (KR) .................. 10-2010-0004750

(51) Int. Cl.
*H01J 9/26* (2006.01)
*H01J 9/40* (2006.01)
*B29C 65/16* (2006.01)
*B23K 26/08* (2006.01)

(52) U.S. Cl. ............ 445/25; 349/190; 219/121.78; 219/121.79; 156/272.2; 156/272.8

(58) Field of Classification Search ........... 445/24, 445/25; 219/121.78, 121.79; 349/187–192; 156/272.8–275.7
See application file for complete search history.

(56) References Cited

U.S. PATENT DOCUMENTS

| 7,006,193 B2* | 2/2006 | von Gutfeld et al. ......... 349/190 |
| 7,425,166 B2* | 9/2008 | Burt et al. .................. 445/25 |
| 2002/0028626 A1* | 3/2002 | Lee et al. .................. 445/24 |
| 2006/0157455 A1 | 7/2006 | Kawai |
| 2007/0128965 A1 | 6/2007 | Burt et al. |
| 2007/0128967 A1 | 6/2007 | Becken et al. |
| 2008/0210675 A1 | 9/2008 | Sasaki et al. |
| 2009/0086325 A1* | 4/2009 | Liu et al. .................. 445/25 |

(Continued)

FOREIGN PATENT DOCUMENTS

JP        2011256092 A  * 12/2011

(Continued)

OTHER PUBLICATIONS

Korean Office action issued by Korean Industrial Property Office on Apr. 29, 2011, corresponding to Korean Patent Application No. 10-2010-0004750 and Request for Entry of the Accompanying Office Action attached herewith.

*Primary Examiner* — Mariceli Santiago
(74) *Attorney, Agent, or Firm* — Robert E. Bushnell, Esq.

(57) ABSTRACT

A laser beam irradiation apparatus irradiates a laser beam to a sealing unit disposed between a first substrate and a second substrate to seal the first substrate and the second substrate. The laser beam irradiation apparatus includes a laser head for irradiating the laser beam; and a control unit for controlling a drive-velocity and a drive-direction of the laser beam. The laser beam is controlled by the control unit which repetitively performs a backward and forward movement along a first direction, and passes a same position at least twice.

29 Claims, 4 Drawing Sheets

U.S. PATENT DOCUMENTS

| | | |
|---|---|---|
| 2009/0261726 A1 | 10/2009 | Gomi |
| 2010/0109516 A1 | 5/2010 | Warashima et al. |

FOREIGN PATENT DOCUMENTS

| | | |
|---|---|---|
| KR | 1020060069284 A | 6/2006 |
| KR | 10-2007-0078501 | 8/2007 |
| KR | 10-2007-0088671 | 8/2007 |
| KR | 10-2007-0088682 | 8/2007 |
| KR | 759098 B1 * | 9/2007 |
| KR | 1020080040601 A | 5/2008 |
| KR | 1020090110231 A | 10/2009 |
| KR | 1020090128431 A | 12/2009 |

* cited by examiner

LASER BEAM IRRADIATION APPARATUS FOR SUBSTRATE SEALING, AND METHOD OF MANUFACTURING ORGANIC LIGHT EMITTING DISPLAY DEVICE BY USING THE LASER BEAM IRRADIATION APPARATUS

CROSS-REFERENCE TO RELATED APPLICATION

This application claims the benefit of Korean Patent Application No. 10-2010-0004750, filed Jan. 19, 2010 in the Korean Intellectual Property Office, the disclosure of which is incorporated herein by reference.

BACKGROUND

1. Field

Aspects of the present invention relate to a laser beam irradiation apparatus for substrate sealing, and a method of manufacturing an organic light emitting display device by using the laser beam irradiation apparatus.

2. Description of the Related Art

Recently, display devices are being replaced with portable, thin flat panel display devices. Among the flat panel display devices, electroluminescent display devices are self-emissive display devices which have a wide viewing angle, an excellent contrast ratio, and a high response speed. Thus, flat panel displays are regarded as next-generation display devices.

An organic light emitting display device includes an emission layer formed of an organic material. The organic light emitting display devices have excellent luminosity, driving voltage, and response speed characteristics compared to inorganic light emitting display devices, and may realize multiple colors.

Conventional organic light emitting display devices have a structure in which at least one organic layer including an emission layer is interposed between two electrodes. When water or oxygen from the outside penetrates into the organic light emitting display device, an electrode material may be oxidized or exfoliation may occur. This may reduce the lifespan and light emitting efficiency of the organic light emitting device, and light emitting colors may be deteriorated. Accordingly, when manufacturing an organic light emitting display device, an organic light emitting device is usually sealed so as to isolate the organic light emitting device from the outside and so that water does not penetrate therein.

Examples of the sealing process include a method in which an inorganic thin film and an organic polymer (such as polyester (PET)) are laminated on a second electrode of an organic light emitting display device. Another sealing process includes a method in which an absorbent is formed in an encapsulation substrate, nitrogen gas is filled in the encapsulation substrate, and then a boundary of the encapsulation substrate is sealed using a sealant such as epoxy.

However, it is impossible to completely block such elements as water or oxygen penetrating from the outside, which destroy the organic light emitting device, by using the above methods. Thus, the methods cannot be applied to the organic light emitting display devices which are particularly vulnerable to water, and a process for realizing the methods is also complicated. In order to solve these problems, a method has been developed in which frit is used as a sealant to improve adhesive properties between a substrate of the organic light emitting device and an encapsulation substrate. By sealing an organic light emitting display device by coating frit on a glass substrate, the substrate of the organic light emitting device substrate and the encapsulation substrate are completely sealed, thereby effectively protecting the organic light emitting display device. A substrate is sealed using frit by coating the frit on a sealing unit of each of organic light emitting display devices and using a laser beam irradiation apparatus to irradiate a laser beam onto a sealing unit of each of the organic light emitting display devices, thereby hardening the frit and sealing the substrate.

SUMMARY

Aspects of the present invention provide a laser beam irradiation apparatus for substrate sealing, and a method of manufacturing an organic light emitting display device by using the laser beam irradiation apparatus capable of performing a high quality frit sealing process without thermally damaging adjacent devices.

According to an aspect of the present invention, there is provided a laser beam irradiation apparatus that irradiates a laser beam to a sealing unit disposed between a first substrate and a second substrate to seal the first substrate and the second substrate, the laser beam irradiation apparatus including a laser head for irradiating the laser beam; and a control unit for controlling a drive-velocity and a drive-direction of the laser beam, wherein the laser beam controlled by the control unit repetitively performs a backward and forward movement along a first direction, and passes a same position at least twice.

According to an aspect of the invention, the backward and forward movement of the laser beam may be performed at a velocity greater than 100 mm/sec.

According to aspects of the invention, the laser beam irradiation apparatus may further include a galvanometer mirror for performing the backward and forward movement of the laser beam, and the control unit may include a program for controlling the galvanometer mirror.

According to an aspect of the invention, the laser head may perform a linear movement along the first direction at a velocity slower than a velocity of the backward and forward movement of the laser beam.

According to an aspect of the invention, a substrate stage may be further arranged below the first substrate and the second substrate, and the substrate stage may perform a linear movement along the first direction at a velocity slower than a velocity of the backward and forward movement of the laser beam.

According to an aspect of the invention, the laser beam may be irradiated in a form of a spot beam.

According to an aspect of the invention, a diameter of the spot beam may be substantially the same as a width of the sealing unit, or less than or twice as large as the width of the sealing unit.

According to an aspect of the invention, a diameter of the spot beam may be less than a width of the sealing unit.

According an aspect of the invention, a movement in a widthwise direction of the sealing unit may be added to the backward and forward movement of the laser beam, whereby the laser beam performs a rotational movement.

According to an aspect of the invention, the sealing unit may include frit.

According to another aspect of the present invention, there is provided a method of manufacturing an organic light emitting display device, the method may include the operations of forming an organic light emitting unit on a first substrate or a second substrate; forming a sealing unit between the first and second substrates to surround the organic light emitting unit; aligning the first substrate and the second substrate; and irradiating the laser beam whereby the laser beam repetitively performs a backward and forward movement along a path of the sealing unit, and the laser beam passes a same position on the path at least twice by using a laser beam irradiation apparatus comprising a laser head for irradiating the laser beam and a control unit for controlling a drive-velocity and a drive-direction of the laser beam.

According to an aspect of the invention, the first substrate or the second substrate may transmit the laser beam.

According to an aspect of the invention, after the laser beam passes the same position at least twice, the same position of the sealing unit may reach a temperature sufficient to seal the first substrate and the second substrate.

According to an aspect of the invention, in the same position of the sealing unit that has reached the temperature sufficient for a sealing operation, the temperature may be linearly decreased for a time longer than a time taken to reach the temperature sufficient for the sealing operation.

According to an aspect of the invention, the backward and forward movement of the laser beam may be performed at a velocity greater than 100 mm/sec.

According to an aspect of the invention, the laser beam irradiation apparatus may include a galvanometer mirror for performing the backward and forward movement of the laser beam, and the control unit may include a program for controlling the galvanometer mirror.

According to an aspect of the invention, the laser head may perform a linear movement along the path of the sealing unit at a velocity slower than a velocity of the backward and forward movement of the laser beam.

According to an aspect of the invention, a substrate stage may further be arranged below the first substrate and the second substrate, and the substrate stage may perform a linear movement along the first direction at a velocity slower than a velocity of the backward and forward movement of the laser beam.

According to an aspect of the invention, the laser beam may be irradiated in a form of a spot beam.

According to an aspect of the invention, a diameter of the spot beam may be substantially the same as a width of the sealing unit, or less than or twice as large as the width of the sealing unit.

According to an aspect of the invention, a diameter of the spot beam may be less than a width of the sealing unit.

According to an aspect of the invention, a movement in a widthwise direction of the sealing unit may be added to the backward and forward movement of the laser beam along the path of the sealing unit, whereby the laser beam performs a rotational movement.

According to an aspect of the invention, the sealing unit may include frit.

According to an aspect of the invention, the frit may form a closed loop to surround the organic light emitting unit.

According to an aspect of the invention, the organic light emitting unit may include at least one organic light emitting device in which at least one organic layer including an emission layer is interposed between a first electrode and a second electrode.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 1:
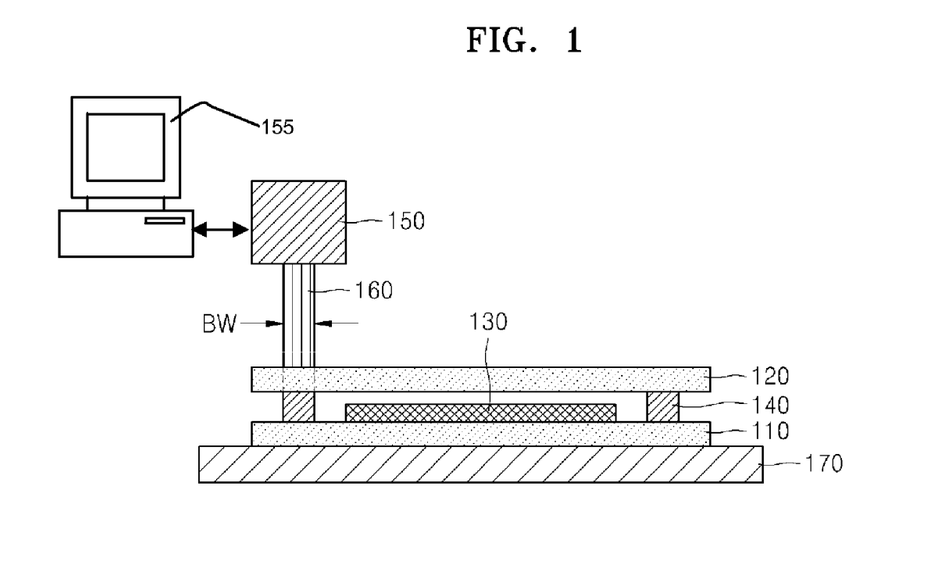
FIG. 1 is a cross-sectional view illustrating a method of sealing a sealing unit of an organic light emitting display device by using a laser beam irradiation apparatus according to an embodiment of the present invention.
Figure 2:
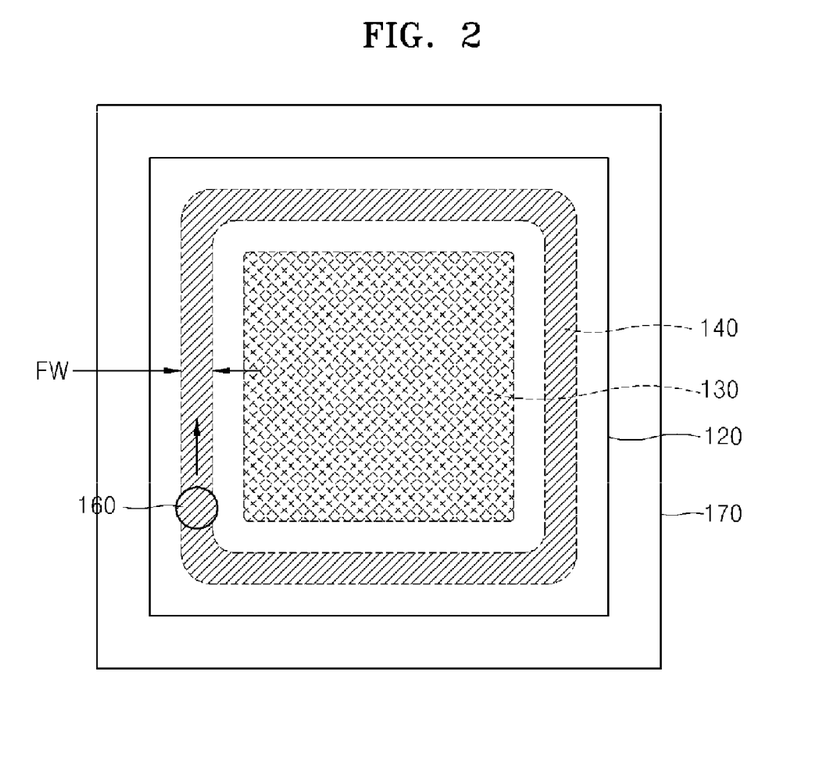
FIG. 2 is a top view of the organic light emitting device of FIG. 1.

FIG. 1 is a cross-sectional view illustrating a method of sealing a sealing unit 140 of an organic light emitting display device by using a laser beam irradiation apparatus according to an embodiment of the present invention. FIG. 2 is a top view of the organic light emitting device of FIG. 1. Referring to FIGS. 1 and 2, an organic light emitting unit 130 and the sealing unit 140 that surrounds the organic light emitting unit 130 are disposed between a first substrate 110 and a second substrate 120. A laser beam 160 is irradiated from a laser head 150 and is irradiated to the sealing unit 140.

The organic light emitting unit 130 is formed on the first substrate 110. The second substrate 120 is an encapsulation substrate that encapsulates the organic light emitting unit 130 formed on the first substrate 110, and through which a laser beam 160 to be described later may be transmitted. The first substrate 110 and/or second substrate 120 may be a glass substrate, but the invention is not limited thereto.

The organic light emitting unit 130 includes at least one organic light emitting device (OLED) (not shown). The OLED includes at least one organic layer (not shown) including an emission layer interposed between a first electrode (not shown) and a second electrode (not shown). The first electrode (not shown) and the second electrode (not shown) may function as an anode for injecting holes and a cathode for injecting electrons, respectively.

The OLED (not shown) may be classified as a passive matrix (PM) OLED and an active matrix (AM) OLED according to whether the OLED is driven using a thin film transistor (TFT). According to the shown embodiment of the present invention, both the PM type and AM type OLED may be used.

The sealing unit 140 is disposed on the second substrate 120 to surround the above-described organic light emitting unit 130. The sealing unit 140 is a closed loop in order to prevent contact between the organic light emitting unit 130 and water or oxygen from the outside.

Edges of the sealing unit 140 forming the closed loop in FIG. 2 are curved with a predetermined curvature but the current embodiment of the present invention is not limited thereto. That is, the edges of the sealing unit 14 may be right-angled without any curvature.

According to the current embodiment, the sealing unit 140 is formed of frit so as to provide tightness between the first substrate 110 and the second substrate 120 to effectively protect the organic light emitting unit 130. The frit is formed to have a predetermined frit width FW by using various methods, such as a screen printing method or a pen dispensing method.

According to the shown embodiment, the sealing unit 140 is formed on the second substrate 120. The organic light emitting unit 130 is formed on the first substrate 110 to align the first substrate 110 and the second substrate 120. However, the present invention is not limited to the shown embodiment. For example, the sealing unit 140 may be formed on the first substrate 110, on which the organic light emitting unit 130 is formed, and aligned with and adhered to the second substrate 120. Also, although only one organic light emitting unit 130 is illustrated in FIGS. 1 and 2, a plurality of the organic light emitting units 130 and a plurality of the sealing units 140 that surround the corresponding organic light emitting units 130 may also be disposed between the first substrate 110 and the second substrate 120.

A laser beam irradiation apparatus (not shown) irradiates the laser beam 160 rapidly moving backward and forward along a path of the sealing unit 140 disposed between the first substrate 110 and the second substrate 120. Although not shown in detail in FIGS. 1 and 2, the laser beam irradiation apparatus (not shown) may include a laser oscillator (not shown) that generates a laser, a beam homogenizer (not shown), the laser head 150 and a control unit 155. The laser oscillator (not shown) may be a bundle type multi core source, which is a high output laser source that is typically used for laser sealing. When using the bundle type multi core source, an output of each of cores may vary, and thus the above non-uniform output may be solved by using the beam homogenizer (not shown).

The laser head 150 may include a reflecting unit (not shown), a driving unit, and a lens unit (not shown). The reflecting unit (not shown) reflects the laser beam 160 that is generated in the laser oscillator (not shown), to irradiate the laser beam 160 to the sealing unit 140. The driving unit (not shown) drives the reflecting unit. The lens unit (not shown) collects the reflected laser beam 160. The reflecting unit (not shown) may use a galvanometer mirror for precisely controlling a position and a velocity of the laser beam 160, such as backward and forward movement of the laser beam 160 according to the present embodiment.

The laser beam 160 that has transmitted through the lens unit (not shown) is irradiated onto the sealing unit 140 in the form of a spot beam having a Gaussian profile. For precise focus control with respect to the laser beam 160, the lens unit (not shown) may include an F-theta lens.

The control unit 155 controls a drive-velocity and a drive-direction of the laser beam 160. In the present embodiment, the control unit 155 may include a program for controlling the galvanometer mirror (not shown) for controlling a position and velocity of the laser beam 160 so as to allow the laser beam 160 to move backward and forward along the path of the sealing unit 140. As such, the control unit 155 can be implemented as at least one processor which uses the program encoded as software or firmware on a computer readable medium.

A substrate stage 170 is disposed below the first substrate 110 so as to have the first substrate 110 arranged thereon. By moving the substrate stage 170, the position of the laser beam 160 may be moved relative to the sealing unit 140.

Figure 3:
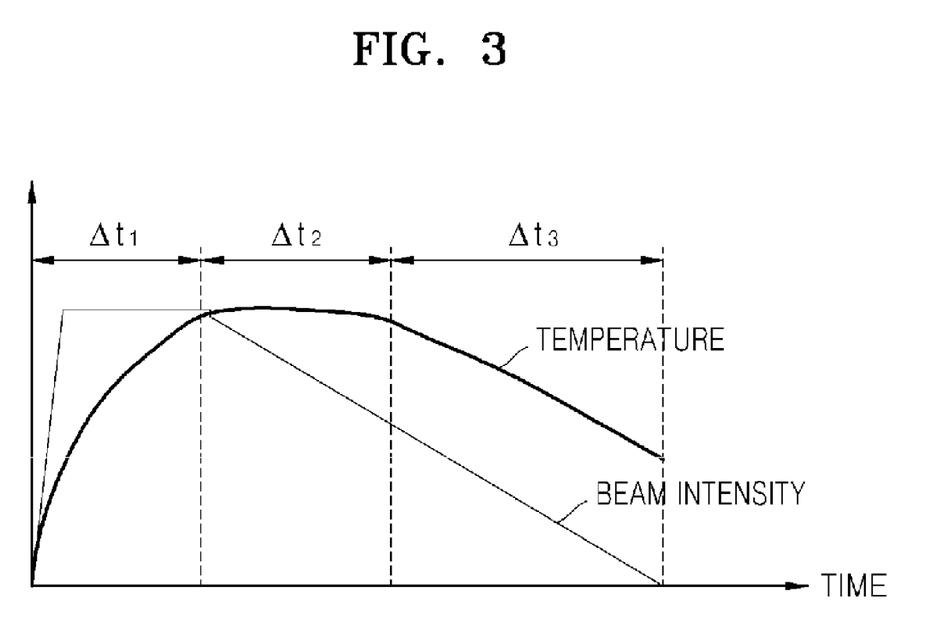
FIG. 3 is a graph for illustrating a preferred temperature profile and beam intensity profile of a frit according to time.

FIG. 3 is a graph for illustrating a preferred temperature profile and beam intensity profile of a frit according to a time. In order to prevent thermal damage to adjacent wiring or organic light emitting devices when the organic light emitting display device is manufactured, it is necessary to control a temperature profile of the frit that is heated by the laser beam 160 when the first and second substrates 110 and 120 are sealed.

Referring to FIG. 3, in the preferred temperature profile of the frit according to time, the frit is initially heated for a short time period ($\Delta t1$) until the frit initially reaches a melting point. A working temperature at which the first substrate 110 and the second substrate 120 may be adhered to each other is maintained for a while ($\Delta t2$). Then, the frit is slowly cooled while the temperature thereof is linearly decreased ($\Delta t3$). As shown, a time ($\Delta t3$) taken for the temperature of the frit to decrease is longer than a time ($\Delta t1$) taken for the frit to melt.

In order to make an ideal temperature profile of the frit according to the time, it is necessary to derive an ideal profile according to a time of a heating flux that is an integration value of intensity of the laser beam 160 regarding time, wherein the laser beam 160 is irradiated to the frit. As a result of a two-dimensional thermal equation modeling operation, it is possible to see that a maximum value of the heating flux according to the present embodiment has to be in an initial state of heating, and then is monotonically decreased, as illustrated in FIG. 3. In order to make such a preferred heating flux profile, the sealing region 140 should be rapidly scanned.

Figure 4:
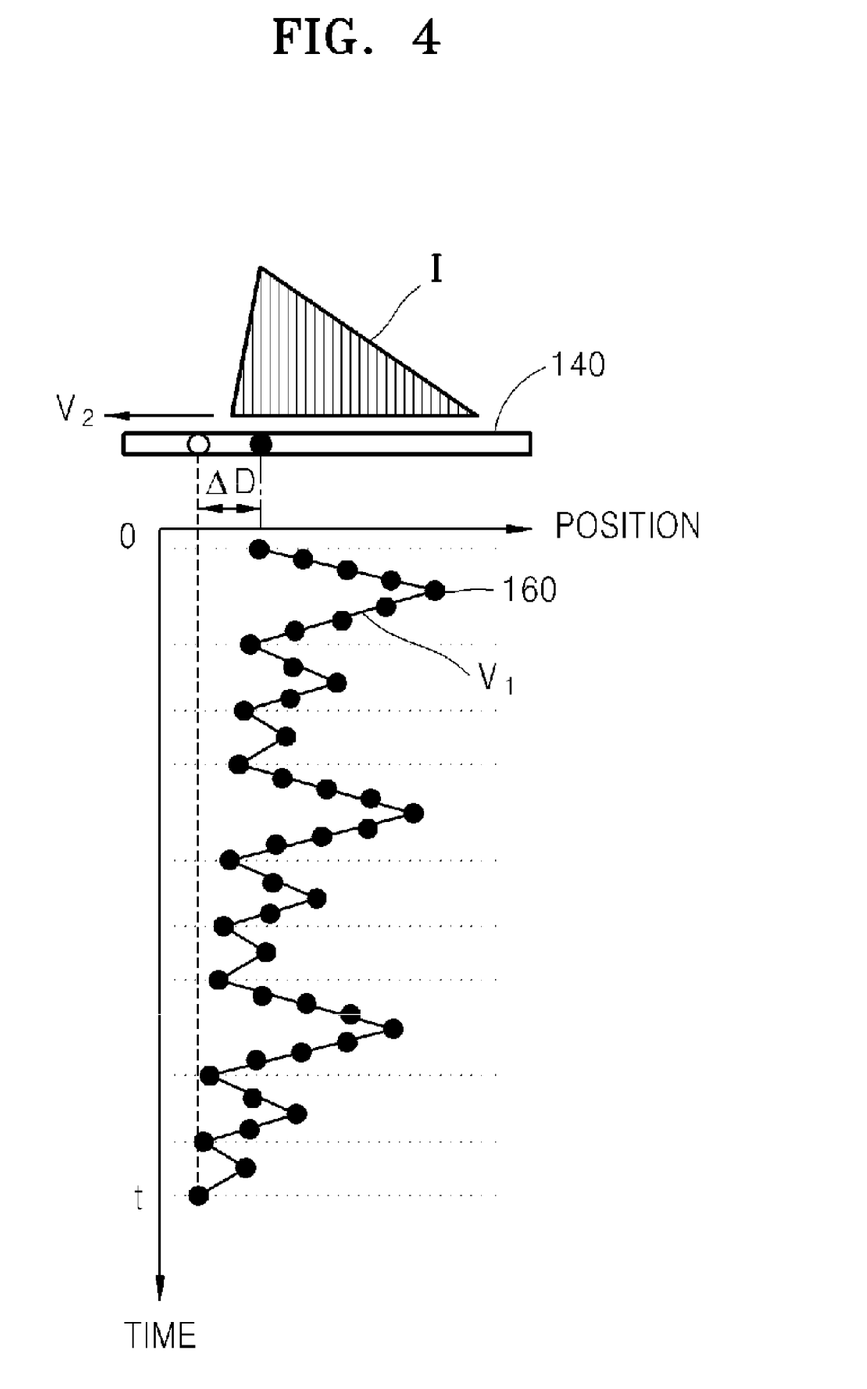
FIG. 4 is a diagram of a position of a laser beam in a sealing path according to time.
Figure 5:
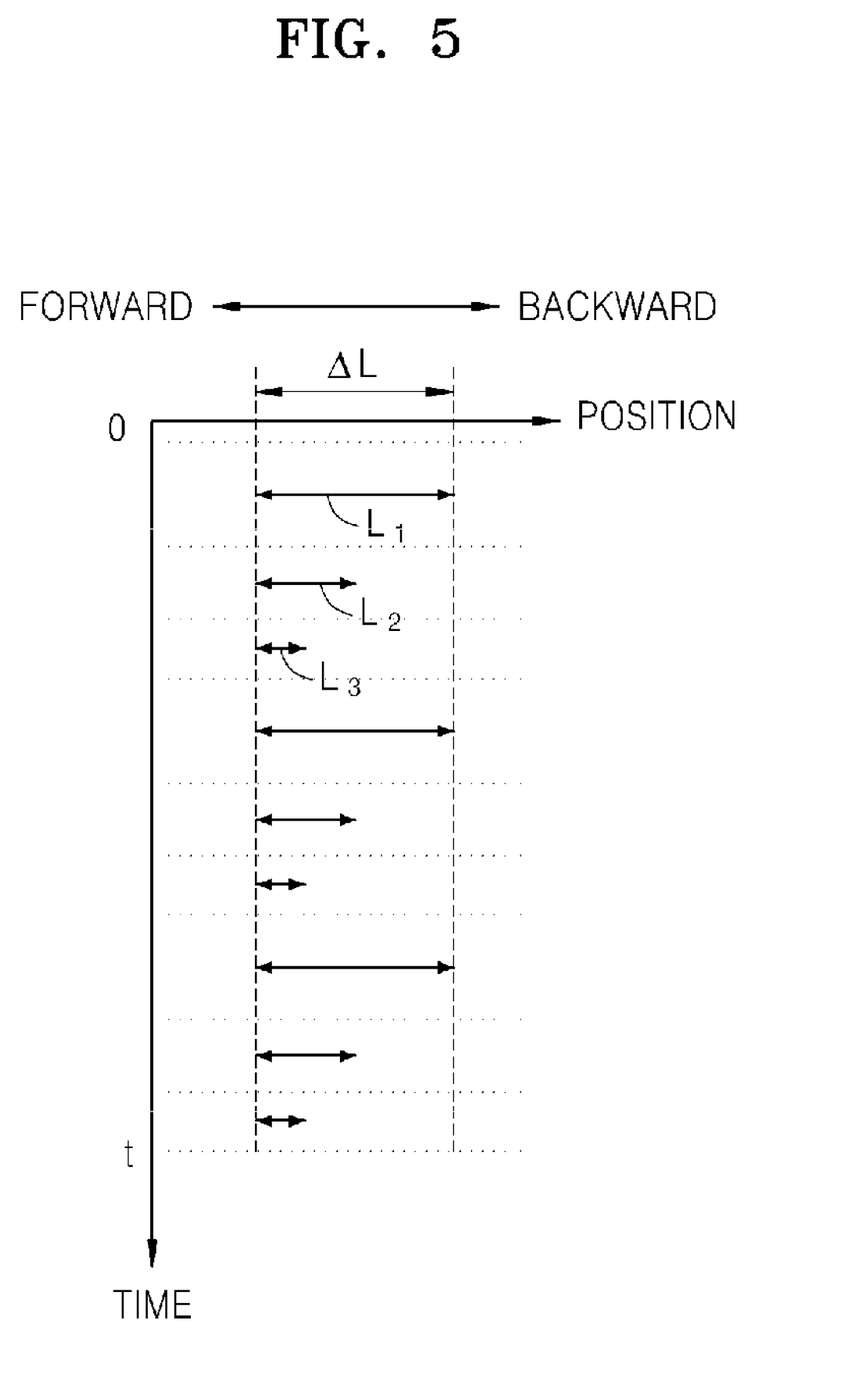
FIG. 5 is a diagram for describing a backward and forward movement of the laser beam when a substrate stage moves.

FIG. 4 is a diagram of a position of the laser beam 160 in a sealing path according to time, and FIG. 5 is a diagram for describing a backward and forward movement of the laser beam 160 when the substrate stage 170 moves. Referring to FIG. 5, the laser beam 160 according to the present embodiment repeatedly and rapidly moves backward and forward along a sealing path of the sealing unit 140. The backward and forward movement of the laser beam 160 in the present embodiment was performed at a velocity of 2500 mm/sec, but the invention is not limited thereto. However, for a rapid scanning speed, the scanning operation should be performed at a velocity greater than 100 mm/sec.

Referring to FIG. 5, the backward and forward movements have different three amplitudes (L1, L2, and L3) and are repeated. As shown, each amplitude oscillates about a different average value. However, the one or more embodiments of the present invention are not limited thereto and fewer or greater numbers of amplitudes can be used.

In order for the laser beam 160 to supply heat to the entire path of the sealing unit 140 while the laser beam 160 moves along the sealing unit 140, a region to receive the laser beam 160 should not be limited to a portion of a region of the sealing unit 140. That is, the laser beam 160 has to move backward and forward not only in a backward and forward repetition region $\Delta L$ but also along the entire path of the sealing unit 140.

Referring to FIG. 4, it is possible to see that the laser beam 160 according to the present embodiment moves forward from an initial position by $\Delta D$ during a time period t while the laser beam 160 moves backward and forward along the sealing unit 140. As such, a starting point for each oscillation changes.

The forward movement may be performed in a manner that the substrate stage 170 moves backward with respect to the laser head 150 while the laser beam 160 moves backward and forward. Also, in the case where the substrate stage 170 is not moved, the laser head 150 may be directly moved forward along the sealing unit 140.

Here, a velocity V1 of the backward and forward movement of the laser beam 160 has to be greater than a forward proceeding velocity V2 of the laser head 150. That is, referring to FIGS. 4 and 5, in the backward and forward movement, the laser beam 160 has to move by 3 (2L1+2L2+2L3)

during the time period t, and in the forward movement, the laser head 150 (or, the substrate stage 170) moves by ΔD during the time period t.

In this manner, when the backward and forward movement and the forward movement of the laser beam 160 complexly occur, the laser beam 160 is irradiated at least twice to the same position of the frit, and the beam intensity I is integrated in the position of the frit to which the laser beam 160 is irradiated. Due to the backward and forward movement and the forward movement of the laser beam 160, the beam intensity I integrated in the frit makes a preferred beam intensity profile according to time. As a result, the preferred temperature profile is achieved.

The present embodiment corresponds to a case in which a laser beam width BW and the frit width FW are substantially the same. However, the one or more embodiments of the present invention are not limited thereto. Thus, the laser beam 160 may have a width greater than the frit width FW. However, in a case where the laser beam width BW is too large, it is required to use a laser mask (not shown) so as to protect adjacent devices of the frit. Thus, it is preferred that the laser beam width BW is at or less than twice as large as the frit width FW.

Also, the laser beam width BW may be less than the frit width FW. However, since the spot beam according to the present embodiment has the Gaussian distribution, the laser beam 160 is not irradiated to an edge of the frit by using only the backward and forward movement of the laser beam 160 and the forward movement of the laser head 150, and thus the ideal temperature profile of the frit may not be obtained. Thus, in a case where a diameter of the spot beam is less than the frit width FW, it is necessary to add a widthwise movement to the backward and forward movement of the laser beam 160. Thus, the movement involves moving the position of the laser beam 160 in a widthwise direction of the frit which is perpendicular to a lengthwise direction of the frit. The combined movement for moving the position of the laser beam 160 in the widthwise direction of the frit may include a predetermined rotational movement. By doing so, the backward and forward movement that is linear, and the rotational movement may be combined so that the laser beam 160 may be irradiated while the laser beam 160 performing a spiral movement crosses an entire width of the frit. Accordingly, the preferred temperature profile may be obtained over the entire frit.

By irradiating the laser beam according to the embodiments of the present invention to the frit, a thermal stress with respect to adjacent components may be minimized so that it is possible to improve performance of the organic light emitting display device. Also, since a separate laser mask is not used according to embodiments of the invention, the sealing process may be simplified. Further, a plurality of cells on a substrate may be efficiently sealed during a short time period according to embodiments of the invention. Moreover, since a melting region of the frit is significantly extended, a start point and an end point are nearly undistinguishable so that a stress due to a temperature difference may be reduced according to embodiments of the invention.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing an organic light emitting display device, the method comprising:

positioning a laser head to irradiate a laser beam onto a sealing unit;

driving a laser beam irradiation apparatus to irradiate the laser beam on the sealing unit disposed between a first substrate and a second substrate to seal the first substrate and the second substrate; and enabling a control unit to control a drive-velocity and a drive-direction of the laser beam such that the laser beam repetitively performs a backward movement and a forward movement along a first direction of the sealing unit, and passes a same position in the sealing unit at least twice.

2. The method of claim 1, wherein the backward and forward movements of the laser beam are performed at a velocity greater than 100 mm/sec.

3. The method of claim 1, wherein:

the laser head further comprises a galvanometer mirror for performing the backward and forward movements of the laser beam, and the control unit stores a computer program executed by a processor in the controller for controlling the galvanometer mirror to perform the backward and forward movements of the laser beam.

4. The method of claim 1, wherein the laser head moves a linearly along the first direction at a velocity slower than a velocity of the backward and forward movements of the laser beam.

5. The method of claim 1, further comprising a substrate stage below the first substrate and the second substrate, wherein the substrate stage performs a linear movement along the first direction at a velocity slower than a velocity of the backward and forward movement of the laser beam.

6. The method of claim 1, wherein the laser beam is irradiated in a form of a spot beam.

7. The method of claim 6, wherein a diameter of the spot beam is in a range which is at or between substantially a width of the sealing unit and twice as large as the width of the sealing unit.

8. The method of claim 6, wherein a diameter of the spot beam is greater than zero and is less than a width of the sealing unit.

9. The method of claim 8, wherein the control unit further controls the laser head to include a movement of the laser beam in a widthwise direction of the sealing unit in addition to the backward and forward movements of the laser beam such that the laser beam performs a rotational movement.

10. The method of claim 1, wherein the sealing unit comprises frit.

11. A method of manufacturing an organic light emitting display device, the method comprising:

forming an organic light emitting unit on a first substrate or a second substrate;

forming a sealing unit between the first and second substrates along a path which surrounds the formed organic light emitting unit;

aligning the first substrate and the second substrate such that the formed organic light emitting unit is between the first and second substrates; and repeatedly moving a laser beam backward and forward along the path of the sealing unit such that the laser beam passes a same position on the path at least twice by using a laser beam irradiation apparatus comprising a laser head for irradiating the laser beam and a control unit for controlling a drive-velocity and a drive-direction of the laser beam.

12. The method of claim 11, wherein the first substrate or the second substrate transmits the laser beam.

13. The method of claim 11, wherein, after the laser beam passes the same position at least twice, the same position of the sealing unit reaches a sealing temperature sufficient to seal the first substrate and the second substrate at the position.

14. The method of claim 13, wherein the repeatedly moving the laser beam backward and forward comprises moving the laser beam such that, at the position, a cooling time during which a temperature linearly decreases from the sealing temperature is longer than a heating time taken to reach the sealing temperature.

15. The method of claim 11, wherein the repeatedly moving the laser beam backward and forward comprises moving the laser beam backward and forward at a velocity greater than 100 mm/sec.

16. The method of claim 11, wherein:
the repeatedly moving the laser beam backward and forward comprises using a galvanometer mirror of the laser beam irradiation apparatus for performing the backward and forward movement of the laser beam, and
executing a computer program using a processor of the control unit for controlling the galvanometer mirror to perform the backward and forward movement of the laser beam.

17. The method of claim 11, further comprising moving the laser head along the path of the sealing unit from the position to a next position at a velocity slower than a velocity of the laser beam while moving backward and forward.

18. The method of claim 11, further comprising moving a substrate stage linearly along a first direction at a velocity slower than a velocity of the laser beam while moving backward and forward, the substrate stage being further arranged below the first substrate and the second substrate.

19. The method of claim 11, further comprising irradiating the laser beam in a form of a spot beam.

20. The method of claim 19, wherein a diameter of the spot beam is within a range that is at or between substantially a width of the sealing unit and twice as large as the width of the sealing unit.

21. The method of claim 19, wherein a diameter of the spot beam is less than a width of the sealing unit and is greater than zero.

22. The method of claim 21, further comprising moving the laser beam in a widthwise direction of the sealing unit while moving laser beam backward and forward such that the laser beam performs a rotational movement along the path of the sealing unit.

23. The method of claim 11, wherein the sealing unit comprises frit.

24. The method of claim 23, wherein the forming the sealing unit comprises forming the frit as a closed loop to surround the organic light emitting unit.

25. The method of claim 11, wherein:
the organic light emitting unit includes at least one organic light emitting device in which at least one organic layer is interposed between a first electrode and a second electrode, and
the at least one organic layer includes an emission layer.

26. The method of claim 11, wherein, the repeatedly moving the laser beam backward and forward comprises the laser beam in a pattern comprising a first waveform having a first amplitude and a second waveform having a second amplitude which is less than the first amplitude.

27. The method of claim 26, wherein the repeatedly moving the laser beam backward and forward comprises repeating the pattern of the first waveform and the second waveform at least twice.

28. The method of claim 26, wherein an average value of the first waveform is not the same as an average value of the second waveform.

29. A computer readable medium encoded with processing instructions for implementing a method of claim 11 performed by at least one processor.

* * * * *